United States Patent
Werth et al.

(10) Patent No.: US 7,839,141 B2
(45) Date of Patent: Nov. 23, 2010

(54) METHOD OF BIASING A MAGNETO RESISTIVE SENSOR ELEMENT

(75) Inventors: Tobias Werth, Villach (AT); Juergen Zimmer, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 505 days.

(21) Appl. No.: 11/838,569

(22) Filed: Aug. 14, 2007

(65) Prior Publication Data
US 2009/0046398 A1 Feb. 19, 2009

(51) Int. Cl.
*G01R 33/09* (2006.01)
*G01B 7/30* (2006.01)

(52) U.S. Cl. .......................... 324/207.21; 324/207.25; 324/252

(58) Field of Classification Search ............ 324/207.21, 324/207.25, 252
See application file for complete search history.

(56) References Cited

U.S. PATENT DOCUMENTS

| | | | |
|---|---|---|---|
| 6,640,652 B2 * | 11/2003 | Kikuchi et al. ......... | 73/862.333 |
| 6,882,146 B2 | 4/2005 | Maiwald | |
| 7,030,601 B2 | 4/2006 | Buchhold | |
| 7,061,232 B2 * | 6/2006 | Haas et al. ............. | 324/207.21 |
| 7,112,955 B2 | 9/2006 | Buchhold | |
| 7,208,944 B2 | 4/2007 | Tatschl et al. | |
| 7,231,325 B2 | 6/2007 | Motz et al. | |
| 7,400,138 B2 * | 7/2008 | Hodin et al. ............ | 324/207.23 |
| 2003/0128027 A1 * | 7/2003 | Buchhold et al. ...... | 324/207.21 |
| 2003/0222642 A1 * | 12/2003 | Butzmann ............. | 324/207.21 |
| 2005/0278136 A1 | 12/2005 | Werth | |

* cited by examiner

*Primary Examiner*—Bot L LeDynh
(74) *Attorney, Agent, or Firm*—Dicke, Billig & Czaja, PLLC

(57) ABSTRACT

A method of biasing a magneto resistive sensor element includes providing at least one magneto resistive sensor element having a magnetic sensitivity along a first axis that is parallel to a plane of the at least one sensor element. A magnet is positioned adjacent to the at least one sensor element for biasing the at least one sensor element, wherein the magnet has a magnetization that is non-perpendicular to the plane of the at least one sensor element, and wherein the magnetization includes a component parallel to the plane of the at least one sensor element that increases a sensitive range of the at least one sensor element along the first axis.

22 Claims, 5 Drawing Sheets

METHOD OF BIASING A MAGNETO RESISTIVE SENSOR ELEMENT

BACKGROUND

Giant magneto resistive (GMR) sensors were first manufactured in the 1980's. They are distinguished by their high sensitivity of their electrical resistance to the orientation of an external magnetic field. The GMR effect takes place in a limited range along one axis of the magnetic field. This range is referred to as the anisotropic range. In the anisotropic range, the sensor has a high sensitivity (resistance change versus magnetic field change). In some applications, such as an incremental speed sensor with a back bias magnet for measuring the speed of a magnetic tooth wheel, a small misplacement or inclination of the back bias magnet with respect to a GMR element of the sensor can drive the working point of the GMR element into saturation. The back bias magnet creates an offset in the working point of the sensor from an optimal point near the center of the anisotropic range, to the saturation region. As a result, no signal or a signal of reduced quality is generated, thereby lowering the sensor performance. For gradiometric sensors that operate on a differential principle, the offset problem becomes worse as the sensors are located in two different positions.

The problem of a GMR element being driven into saturation can be avoided by an increase of the anisotropic range. The anisotropic range where the sensor is sensitive can be extended with technology variations or geometric variations of the sensor, but then different sensors for different applications have to be developed. Furthermore, the extension of the sensitivity range by geometric variations (e.g., lowering the GMR structure width) is restricted due to limitations of state-of-the-art etching processes for the GMR layer.

One prior approach uses a groove or cavity in the magnet or a shaped metal plate to keep magneto resistive sensors in an optimal working point. Disadvantages of this approach are the higher costs for the additional grooving of the magnet or the additional special shaped metal plate.

Another solution for reducing the offset induced by the back bias magnet is to reduce the strength of the magnet. However, this approach reduces proportionally the magnetic signal generated by the passing magnetic tooth wheel.

SUMMARY

One embodiment provides a method of biasing a magneto resistive sensor element. The method includes providing at least one magneto resistive sensor element having a magnetic sensitivity along a first axis that is parallel to a plane of the at least one sensor element. A magnet is positioned adjacent to the at least one sensor element for biasing the at least one sensor element, wherein the magnet has a magnetization that is non-perpendicular to the plane of the at least one sensor element, and wherein the magnetization includes a component parallel to the plane of the at least one sensor element that increases a sensitive range of the at least one sensor element along the first axis.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
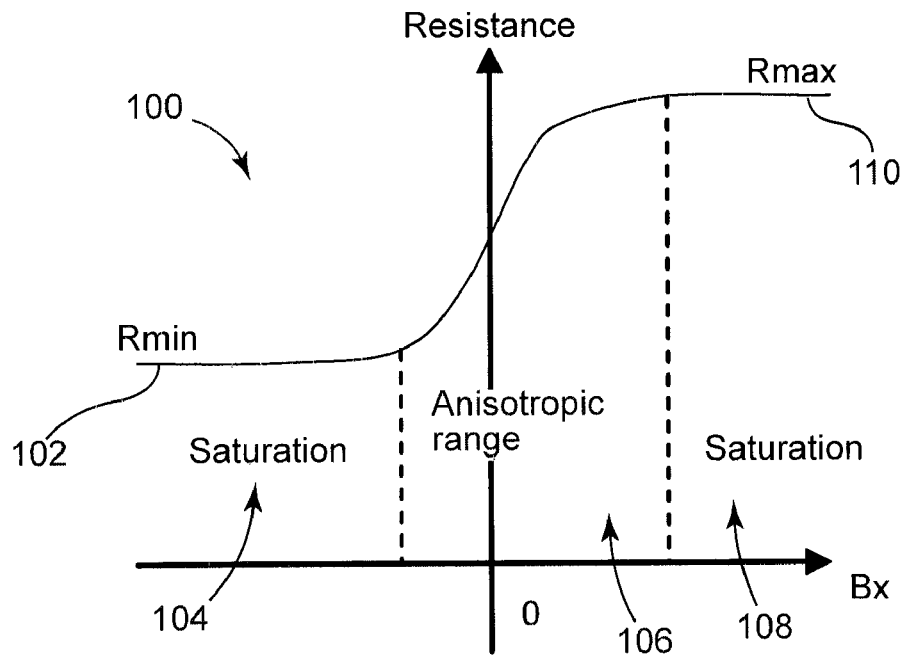
FIG. 1 is a graph of resistance versus magnetic field for a GMR sensor.

FIG. 1 is a graph 100 of resistance versus magnetic field for a GMR sensor based on the so-called spin-valve (SV) concept. A spin-valve GMR sensor structure basically consists of a reference layer with a fixed magnetization direction and a sensor layer which can rotate its magnetization according to an external in-plane magnetic field. The main GMR effect then takes place between the sensor and reference layer. For the case in which the reference magnetization direction points along the x-axis (i.e., parallel to the external magnetic field axis), and the anisotropy axis is along the y-axis, FIG. 1 shows a typical so-called minor loop behavior with a characteristic linear transition region from a low ohmic state to a high ohmic state.

The horizontal axis in graph 100 represents the magnitude of a magnetic field (Bx) applied to the sensor in an x-axis parallel to the plane of the sensor, and the vertical axis represents the resistance of the sensor. For relatively small magnetic fields in the x-axis, the sensor operates in the anisotropic range 106, and the resistance of the sensor changes with the applied magnetic field. In the anisotropic range 106, the sensor has a high sensitivity (i.e., resistance change versus magnetic field change). For larger magnetic fields in the x-axis, the sensor operates in a saturation region 104 or 108, and the resistance of the sensor no longer changes with the applied magnetic field (or changes very little). In the saturation region 104, the resistance of the sensor remains substantially constant at a minimum resistance value (Rmin) 102. In the saturation region 108, the resistance of the sensor remains substantially constant at a maximum resistance value (Rmax) 110 as long as the magnetic field range stays within the minor loop magnetic field region (which is dependent on stack design, but is typically less than 100 mT (milli-Tesla)).

Figure 2:
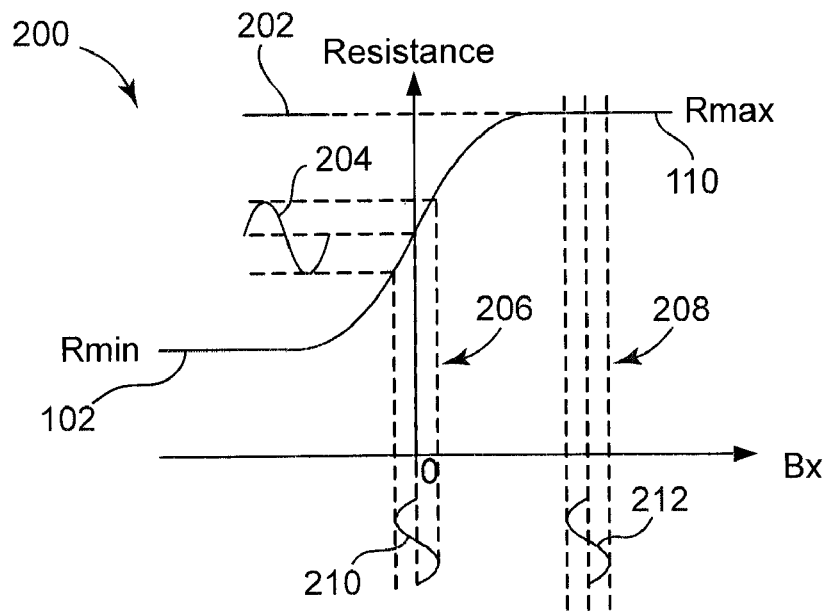
FIG. 2 is another graph of resistance versus magnetic field for a GMR sensor.

FIG. 2 is another graph 200 of resistance versus magnetic field for a GMR sensor. Again, the horizontal axis represents the magnitude of the magnetic field (Bx) applied to the sensor in an x-axis parallel to the plane of the sensor, and the vertical axis represents the resistance of the sensor. Two working points 206 and 208 of the sensor are shown in FIG. 2. Working point 206 represents an optimal working point, and working point 208 represents a working point that is outside of the sensitivity range of the sensor. As mentioned above in the Background section, a small misplacement or inclination of a back bias magnet with respect to the GMR sensor can drive the working point of the GMR element into saturation. Working point 208 represents such a point, which has been offset from the optimal point 206 and into the saturation region.

As shown in FIG. 2, for the optimal working point 206, when a magnetic field signal 210 is applied to the sensor, a corresponding resistance change signal 204 is generated in the sensor. However, for the working point 208, when a magnetic field signal 212 is applied to the sensor, the resulting resistance change signal 202 is flat. Since working point 208 is in the saturation region of the sensor, the applied signal 212 does not change the resistance of the sensor, and the resulting signal 202 remains constant at the maximum resistance value (Rmax).

Figure 3:
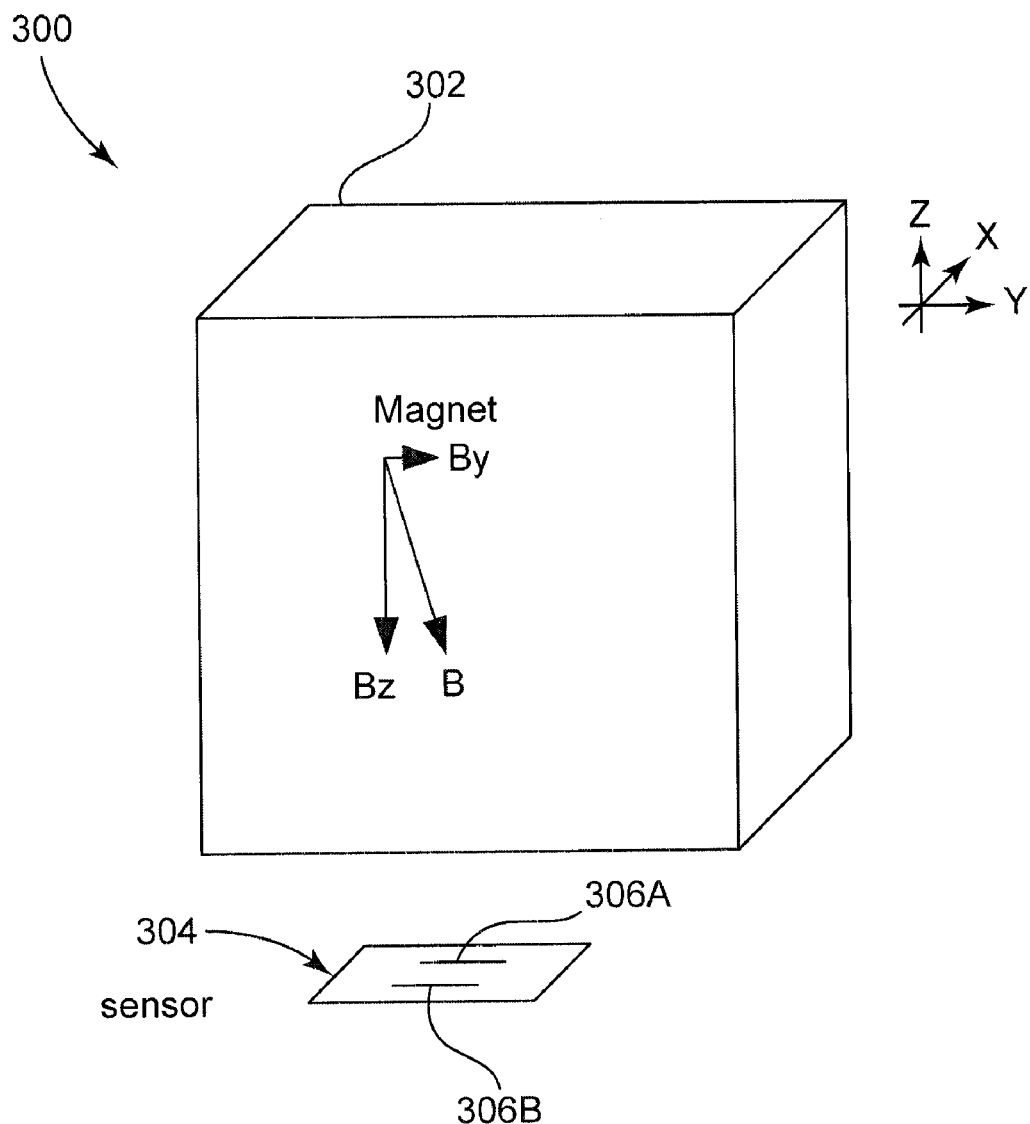
FIG. 3 is a diagram illustrating a magneto resistive sensor with a non-perpendicular bias magnetization according to one embodiment.

FIG. 3 is a diagram illustrating a magneto resistive sensor 300 with a non-perpendicular bias magnetization according to one embodiment. Magneto resistive sensor 300 includes a back bias magnet 302 and a sensor element 304. In the illustrated embodiment, sensor element 304 is configured as a differential sensor, and includes two magnetic field sensitive elements (e.g., magneto resistive elements) 306A and 306B. In other embodiments, sensor 300 includes a single magnetic field sensitive element, or more than two such elements. In one embodiment, sensor element 304 also includes an evaluation integrated circuit (not shown) for processing signals generated by the elements 306A and 306B.

In one embodiment, sensor element 304 is a GMR sensor, and elements 306A and 306B are GMR elements. In other embodiments, elements 306A and 306B are other types of magnetic field sensitive elements, such as Hall sensor elements or xMR elements (e.g., AMR—anisotropic magneto resistance; TMR—tunnel magneto resistance; CMR—colossal magneto resistance). In one embodiment, sensor element 304 is a spin-valve GMR sensor, and includes a reference layer with a fixed magnetization direction and a sensor layer which can rotate its magnetization according to an external in-plane magnetic field. In one embodiment, sensor 300 is configured to measure the speed or position of teeth of a magnetic gear wheel (or magnetic tooth wheel). In another embodiment, sensor 300 is configured as a gradiometric sensor for measuring magnetic field gradients.

A set of orthogonal x-y-z axes are shown in FIG. 3. The x-axis and the y-axis are parallel to the plane of the sensor element 304. The z-axis is perpendicular to the plane of the sensor element 304. GMR sensors, such as one embodiment of sensor element 304, are sensitive to only one component of the magnetic field (here defined as the x-component). In conventional applications, the back bias magnet has a magnetic field that is perpendicular to the sensor plane (i.e., a magnetic field with a z-component, but no x or y component). The field produced by the back bias magnet is modulated (e.g., by a passing magnetic tooth wheel) to generate the x-field signal. Due to the properties of the GMR element, the x-field signal is converted into resistance change.

In one embodiment, rather than just including a z-component, the magnetic field of the back bias magnet 302 also includes a y-component. The y-component of the field of the back bias magnet 302 is represented in FIG. 3 by vector, By, and the z-component is represented by vector, Bz. These two components result in a magnetic field B, which is non-perpendicular to the bottom surface of the magnet 302, and which is non-perpendicular to the sensor plane (i.e., the x-y plane). The y-component of the field generated by the back bias magnet 302 extends proportionally the sensitive range of the sensor element 304 along the x-axis. In one embodiment, back bias magnet 302 is a cubic magnet with a magnetization that is not completely perpendicular to the sensor plane, but also has a y-field component that extends the sensitive range of the sensor element 304 along the x-axis. In another embodiment, back bias magnet 302 is a cylindrically-shaped magnet with a non-perpendicular magnetization direction (i.e., a magnetization with a z-component and a y-component).

Figure 4:
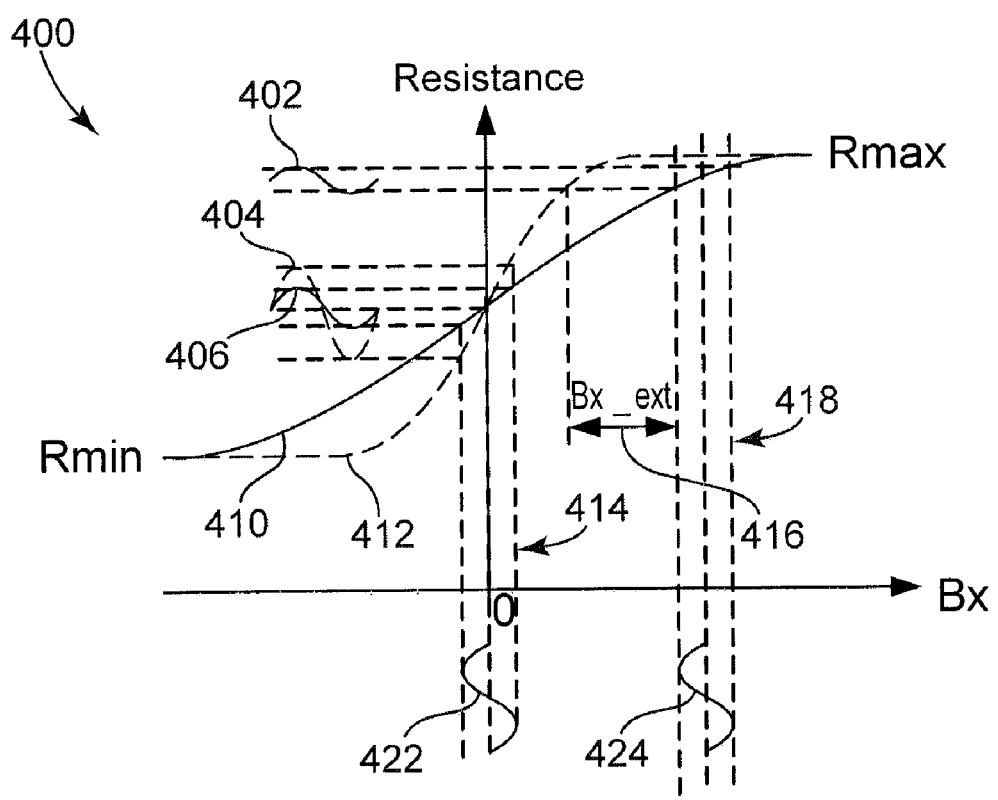
FIG. 4 is a graph of resistance versus magnetic field for the magneto resistive sensor shown in FIG. 3 according to one embodiment.

FIG. 4 is a graph 400 of resistance versus magnetic field for the magneto resistive sensor element 304 shown in FIG. 3 according to one embodiment. The horizontal axis represents the magnitude of the magnetic field (Bx) applied to the sensor element 304 in the x-axis parallel to a plane of the sensor element 304, and the vertical axis represents the resistance of the magneto resistive elements 306A and 306B. Two curves 410 and 412 are shown in FIG. 4. Curve 412 (shown with hidden lines) represents the resistance versus magnetic field (Bx) of the magneto resistive sensor elements 306A and 306B when a back bias magnet applies a magnetic field that is perpendicular to the sensor plane (i.e., a magnetic field that only includes a Bz component). Curve 410 represents the resistance versus magnetic field (Bx) of the magneto resistive sensor elements 306A and 306B using the back bias magnet 302, which applies a magnetic field that is non-perpendicular to the sensor plane (i.e., the magnetic field includes a Bz component and a By component). By using the back bias magnet 302 with such a non-perpendicular field, the linear range of the sensor 304 is increased by an amount 416 (Bx_ext).

Two working points 414 and 418 of the sensor element 304 are shown in FIG. 4. Working point 414 represents an optimal working point, and working point 418 represents a working point that is outside of the sensitivity range of the sensor 304 when a perpendicular bias magnetic field is applied to the sensor element 304. As shown in FIG. 4, for the optimal working point 414, when a magnetic field signal 422 is applied to the sensor element 304, a corresponding resistance change signal 404 or 406 is generated by the sensor element 304. Signal 404 (shown with hidden lines) represents the resistance change when a perpendicular bias magnetic field is applied to the sensor element 304 (i.e., curve 412), and signal 406 represents the resistance change for the sensor 304 when a non-perpendicular bias magnetic field is applied to the sensor element 304 (i.e., curve 410). The non-perpendicular bias magnetic field causes curve 410 to be slightly flatter than curve 412, which results in the signal 406 being slightly smaller than signal 404.

For the working point 418, when a magnetic field signal 424 is applied to the sensor element 304 with a non-perpendicular bias magnetic field (i.e., curve 410), a corresponding resistance change signal 402 is generated by the sensor element 304. When the magnetic field signal 424 is applied to the sensor element 304 with a perpendicular bias magnetic field (i.e., curve 412), the resulting resistance change signal is flat.

Since working point 418 is in the saturation region of the sensor element 304 (when a perpendicular bias magnetic field is applied to the sensor element 304), the applied signal 424 does not change the resistance of the sensor element 304, and the resulting signal remains constant at the maximum resistance value (Rmax). Thus, as shown in FIG. 4, the non-perpendicular bias magnetic field results in an extension of the sensitive range of the sensor element 304 along the x-axis, such that the sensor element 304 still produces a resistance change signal at working points where no such signal would be generated with a perpendicular bias magnetic field.

Figure 5:
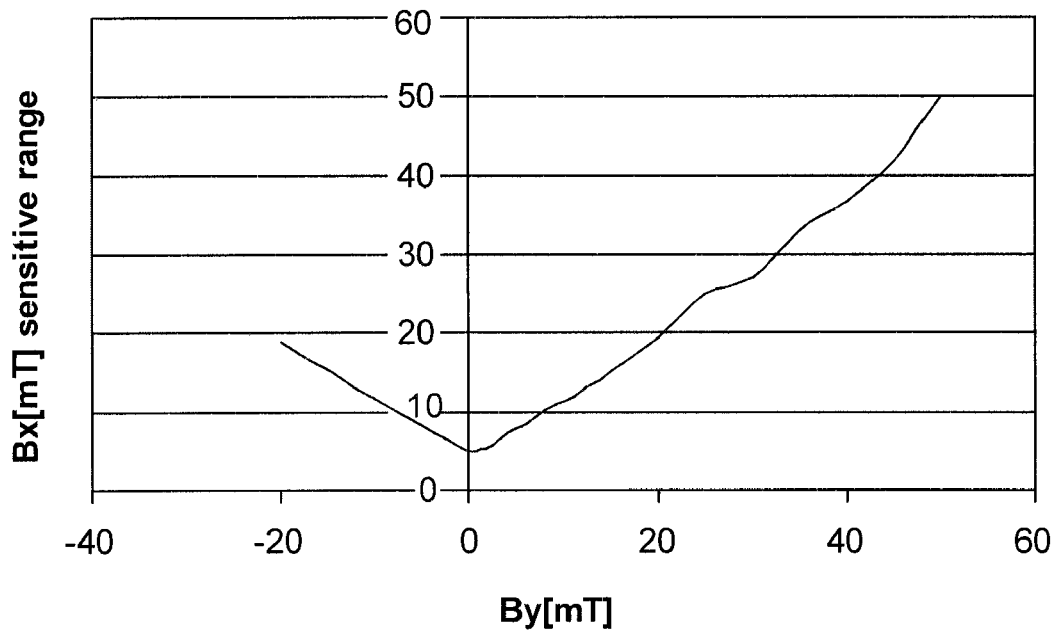
FIG. 5 is a graph of the sensitivity range of the magneto resistive sensor shown in FIG. 3 according to one embodiment.

FIG. 5 is a graph of the sensitivity range of the magneto resistive sensor element 304 shown in FIG. 3 according to one embodiment. The horizontal axis in the graph represents the magnitude of the y component (By) of the bias magnetic field applied to sensor element 304 by magnet 302 in mT (milli-Tesla) units, and the vertical axis represents the sensitivity range of sensor 304 in the x-direction in mT units. The sensitive range of sensor element 304 is extended in accordance with the field strength of the y-component of the field produced by the magnet 302. As shown in FIG. 5, the sensitivity range of sensor element 304 increases almost linearly with an increasing magnitude of the y-component (By) of the bias magnetic field applied by magnet 302. Even if the extension of the linear transition region results in a decrease in sensor sensitivity (e.g., the signal 406 in FIG. 4 is smaller than the signal 404), an advantage of the extension is that the sensor element 304 is more likely to always be operating in a sensitive working point. In one embodiment, magnet 302 has a y-component (By) of greater than 10 mT. In another embodiment, magnet 302 has a y-component (By) of greater than 20 mT. In yet another embodiment, magnet 302 has a y-component (By) of greater than 40 mT.

Figure 6:
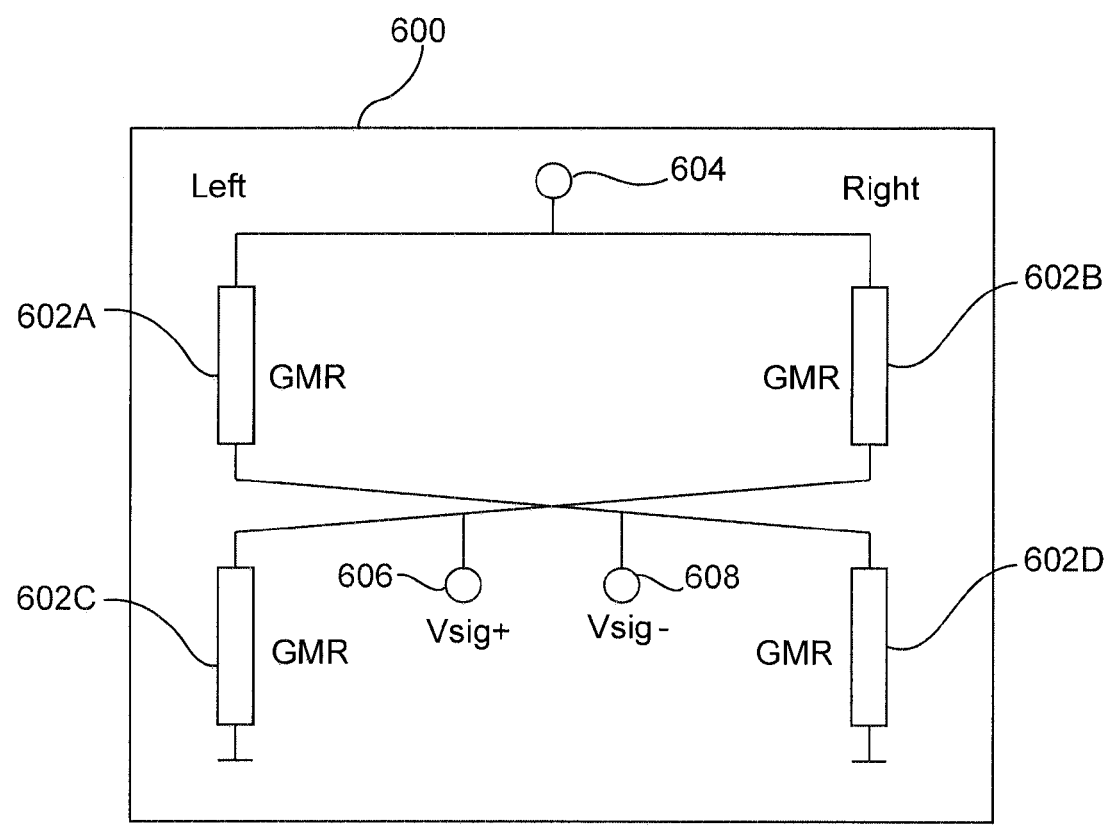
FIG. 6 is a diagram illustrating a magneto resistive sensor bridge according to one embodiment.

FIG. 6 is a diagram illustrating a magneto resistive sensor bridge 600 according to one embodiment. In one embodiment, sensor element 304 (FIG. 3) is configured as a sensor bridge 600. As shown in FIG. 6, sensor bridge 600 includes four GMR elements 602A-602D. A voltage is applied to input terminal 604, and the output of the bridge 600 is measured at output terminals 606 and 608 (Vsig+ and Vsig−). In response to an external magnetic field, one or more of the GMR elements 602A-602D change in electrical resistance, causing a voltage signal at the bridge output terminals 606 and 608.

In back bias magneto resistive sensor applications, a magnet is already present. By using the already present back bias magnet itself to extend the sensitive range of the sensor, embodiments of the present invention provide a simpler and less expensive solution than the previous proposals that involve forming grooves or cavities in the back bias magnet and using a special shaped metal plate. By using the back bias magnet itself to extend the sensitive range via a non-perpendicular magnetic field, the sensitivity can be adapted for each application as desired. Due to the extended range of the sensor, a misalignment or misplacement between sensor and magnet is no longer critical, resulting in sensors that are more tolerant against such misalignment.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of biasing a magneto resistive sensor element, comprising:
providing at least one magneto resistive sensor element having a magnetic sensitivity along a first axis that is parallel to a plane of the at least one sensor element; and
positioning a magnet adjacent to the at least one sensor element for biasing the at least one sensor element, wherein the magnet has a magnetization that is non-perpendicular to the plane of the at least one sensor element, and wherein the magnetization includes a component parallel to the plane of the at least one sensor element that increases a sensitive range of the at least one sensor element along the first axis, wherein the component parallel to the plane of the at least one sensor element has a magnitude of greater than about 10 mT.

2. The method of claim 1, wherein the at least one magneto resistive sensor element comprises at least one GMR element.

3. The method of claim 1, wherein the at least one magneto resistive sensor element comprises a plurality of magneto resistive sensor elements configured to operate in a differential manner.

4. The method of claim 1, wherein the at least one magneto resistive sensor element comprises four GMR elements arranged in a bridge configuration.

5. The method of claim 4, wherein the four GMR elements arranged in a bridge configuration comprise a gradiometric sensor.

6. The method of claim 1, wherein the at least one magneto resistive sensor element is configured to measure position or speed of a magnetic gear wheel.

7. The method of claim 1, wherein the magnet is a cubic magnet.

8. The method of claim 1, wherein the magnet is a cylindrically-shaped magnet.

9. The method of claim 1, wherein the first axis is in an x-axis, wherein the magnet has a magnetization with a first component along a z-axis perpendicular to the plane of the at least one sensor element and with a second component along a y-axis parallel to the plane of the sensor element, wherein the x, y, and z axes are orthogonal axes, and wherein the second component increases the sensitive range of the at least one sensor element along the x-axis.

10. The method of claim 9, wherein the second component has a magnitude of greater than about 20 mT.

11. The method of claim 9, wherein the second component has a magnitude of greater than about 40 mT.

12. A magneto resistive sensor, comprising:
at least one magneto resistive sensor element having a magnetic sensitivity in an x-axis that is parallel to a plane of the at least one sensor element; and
a back bias magnet configured to bias the at least one sensor element with a magnetic field having a first component along a z-axis perpendicular to the plane of the at least one sensor element, and having a second component along a y-axis parallel to the plane of the at least one sensor element, wherein the x, y, and z axes are orthogonal axes, and wherein the second component increases a sensitive range of the at least one sensor element along the x-axis, and wherein the second component has a magnitude of greater than about 10 mT.

13. The sensor of claim 12, wherein the at least one magneto resistive sensor element comprises at least one GMR element.

14. The sensor of claim 12, wherein the at least one magneto resistive sensor element comprises a plurality of magneto resistive sensor elements configured to operate in a differential manner.

15. The sensor of claim 12, wherein the at least one magneto resistive sensor element comprises four GMR elements arranged in a bridge configuration.

16. The sensor of claim 12, wherein the magneto resistive sensor is configured as a gradiometric sensor.

17. The sensor of claim 12, wherein the at least one magneto resistive sensor element is configured to measure position or speed of a magnetic gear wheel.

18. The sensor of claim 12, wherein the magnet is a cubic magnet.

19. The sensor of claim 12, wherein the magnet is a cylindrically-shaped magnet.

20. The sensor of claim 12, wherein the second component has a magnitude of greater than about 20 mT.

21. The sensor of claim 12, wherein the second component has a magnitude of greater than about 40 mT.

22. A GMR sensor, comprising:
a sensor element having a plurality of GMR elements, each GMR element having a magnetic sensitivity in an x-axis that is parallel to a plane of the sensor element; and
a magnet configured to bias the sensor element with a magnetic field having a first component along a z-axis perpendicular to the plane of the sensor element, and having a second component along a y-axis parallel to the plane of the sensor element, wherein the x, y, and z axes are orthogonal axes, and wherein the second component has a magnitude of greater than about 10 mT.

* * * * *